United States Patent
McKinley et al.

(10) Patent No.: US 9,722,551 B1
(45) Date of Patent: Aug. 1, 2017

(54) SYSTEM AND METHOD FOR PROVIDING A SWITCHLESS SELECTABLE INPUT BALANCED LOW NOISE AMPLIFIER

(71) Applicant: LOCKHEED MARTIN CORPORATION, Bethesda, MD (US)

(72) Inventors: William Scott McKinley, Clermont, FL (US); Eugene Fischer, Clermont, FL (US)

(73) Assignee: LOCKHEED MATRIN CORPORATION, Bethesda, MD (US)

( * ) Notice: Subject to any disclaimer, the term of this patent is extended or adjusted under 35 U.S.C. 154(b) by 0 days.

(21) Appl. No.: 14/728,317

(22) Filed: Jun. 2, 2015

Related U.S. Application Data

(63) Continuation-in-part of application No. 14/623,581, filed on Feb. 17, 2015, now Pat. No. 9,435,838.

(60) Provisional application No. 62/007,170, filed on Jun. 3, 2014.

(51) Int. Cl.
*H03F 3/68* (2006.01)
*H03F 3/19* (2006.01)
*H03G 3/18* (2006.01)

(52) U.S. Cl.
CPC .......... *H03F 3/19* (2013.01); *H03G 3/18* (2013.01); *H03F 2200/294* (2013.01); *H03F 2200/451* (2013.01)

(58) Field of Classification Search
CPC ........ H03F 3/18; H03F 3/19; H03F 2200/294; H03F 2200/451
USPC .............. 330/53, 107, 124 R, 295; 333/109; 455/13.4
See application file for complete search history.

(56) References Cited

U.S. PATENT DOCUMENTS

| | | | |
|---|---|---|---|
| 5,815,113 A | * | 9/1998 | Lo .............................. H03D 1/10 342/351 |
| 5,949,845 A | | 9/1999 | Sterzer |
| 6,834,991 B2 | | 12/2004 | Roeder |
| 7,034,516 B2 | | 4/2006 | Ammar |
| 7,135,848 B1 | | 11/2006 | Ammar |
| 7,199,570 B2 | | 4/2007 | Ammar |
| 7,221,139 B2 | | 5/2007 | Ammar |
| 7,239,122 B2 | | 7/2007 | Ammar |
| 7,250,747 B1 | | 7/2007 | Ammar |
| 7,603,088 B2 | | 10/2009 | Ammar |
| 2005/0063447 A1 | | 3/2005 | Ammar |
| 2005/0122254 A1 | | 6/2005 | Ammar |
| 2006/0121873 A1 | | 6/2006 | Ammar |

* cited by examiner

*Primary Examiner* — Steven J Mottola
*Assistant Examiner* — Hafizur Rahman
(74) *Attorney, Agent, or Firm* — Terry M. Sanks, Esq.; Beusse Wolter Sanks & Maire, PLLC

(57) ABSTRACT

A selective low noise amplifier (LNA) comprising an input hybrid coupler receives a first input and a second input and to provide a first output and a second output; and an output hybrid coupler receives a first input and a second input and to provide for at least one output. A first amplifier and a second amplifier, each respective amplifier in first and second parallel paths are couple to and between the first output and the second output, respectively, of the input hybrid coupler and the first input and the second input, respectively, of the output hybrid coupler. A phase controller coupled to at least one of the first input and the second input of the output hybrid coupler delays signals from the first and second inputs of the output hybrid coupler to the at least one output of the output hybrid coupler. A method is also disclosed.

19 Claims, 8 Drawing Sheets

SYSTEM AND METHOD FOR PROVIDING A SWITCHLESS SELECTABLE INPUT BALANCED LOW NOISE AMPLIFIER

CROSS-REFERENCE TO RELATED APPLICATIONS

This application claims the benefit of U.S. Provisional Application No. 62/007,170 filed Jun. 3, 2014, incorporated herein by reference as if set forth in full below. This application is Continuation-In-Part of U.S. application Ser. No. 14/623,581 filed Feb. 17, 2015, which is also incorporated herein by reference as if set forth in full below.

BACKGROUND

A radiometer is a device for measuring the radiant flux (power) of electromagnetic radiation. Because electromagnetic radiation can be correlated to temperature, the radiometer is generally a popular choice in sensing thermal radiation in many different applications (e.g., terrestrial and extra-terrestrial sensing, medical diagnostics, defense applications, weather, and so on). Even though the term radiometer is often used to denote an infrared radiation detector, the designation radiometer also includes detectors operating on any electromagnetic wavelength.

While several types of radiometric devices are available, the comparison type of radiometer is generally the most widely used. One particular type of comparison radiometer, often referred to as a Dicke radiometer, uses the microware/millimeter wave frequency bands (i.e., the MMW radiometer) and compares an incoming signal to a standard or calibrated reference signal, which is based on a known temperature. By comparing the incoming signal to the reference signal, the temperature of the scene that was sensed can be determined.

Depending on the particular application for which it will be used, the comparison type of radiometer may be implemented in a microwave monolithic integrated circuit (MMIC) or through discrete implementation using printed hybrids and multiple low noise amplifiers (LNAs).

Unfortunately, the comparison type of radiometer employs a radio frequency (RF) switch to toggle between the two available inputs. The RF switch may be used to switch between one input corresponding to the sensed scene and another input corresponding to the reference load. However, since RE switches are lossy devices, they may significantly and undesirably diminish the low noise performance of the radiometer. Eliminating the switch loss, while preserving input selectivity, will improve radiometric performance.

SUMMARY

Embodiments relate to balanced low noise amplifiers such as for radiometers. An aspect of an embodiment includes a selective low noise amplifier (LNA) comprising: an input hybrid coupler configured to receive a first input and a second input and to provide a first output and a second output; and an output hybrid coupler configured to receive a first input and a second input and to provide for at least one output. The LNA includes a first amplifier and a second amplifier, each respective amplifier in first and second parallel paths couple to and between the first output and the second output, respectively, of the input hybrid coupler and the first input and the second input, respectively, of the output hybrid coupler. The LNA include a phase controller coupled to at least one of the first input and the second input of the output hybrid coupler to delay signals from the first and second inputs of the output hybrid coupler to the at least one output of the output hybrid coupler.

An aspect of the embodiments includes a selective low noise amplifier (LNA), comprising: first and second parallel amplifier channels producing first and second amplified signals, each parallel amplifier channel having at least one amplifier; and a phase shifter coupled to the first parallel amplifier channel, the phase shift to shift a phase of the first amplified signal from the first parallel amplifier channel to create a phase shifted signal. The LNA includes an output hybrid coupler comprising at least one output line, a first input coupled to the first parallel amplifier channel via the phase shifter and a second input coupled to the second parallel amplifier channel, the output hybrid coupler to generate an output on one of the at least one output line of the second amplified signal of the second parallel amplifier channel and the phase shifted signal from of the first parallel amplifier channel.

Another aspect of the embodiments includes a method including receiving dual input signals into an input selective low noise amplifier, phase shifting the signals from a zero degree phase shift to a one hundred and eighty degree phase shift to produce a desired signal with a phase bit connected between two hybrids, and producing a single output signal responsive to the phase shift and at least one input signal of the dual input signals.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1:
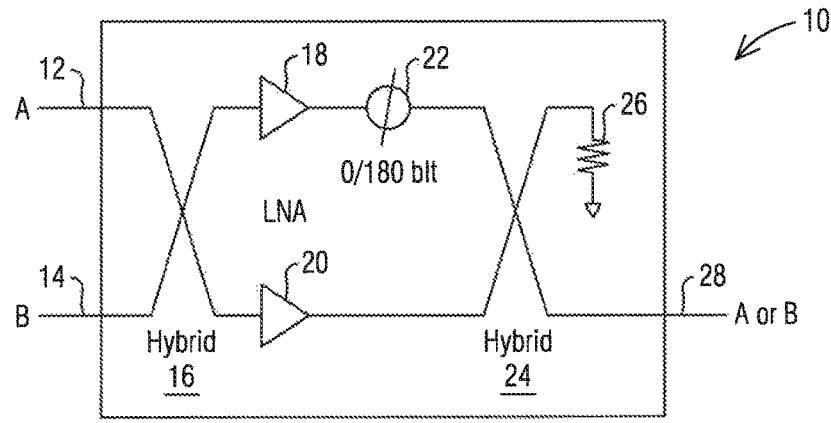
FIG. 1 shows an embodiment of input selective low noise amplifier including a phase bit.

Embodiments are described herein with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, readily recognizes that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Embodiments in a specific context, namely an input selective low noise amplifier in a microwave monolithic integrated circuit (MMIC) implementation or design are disclosed herein. The embodiments may also be applied, however, to radiometers in other configurations or to other integrated circuits, electronic structures and components, and the like.

FIG. 1 shows an embodiment of an input selective low noise amplifier. As shown, the input selective low noise amplifier 10 may include a first input 12, a second input 14, a first hybrid device 16, a first amplifier 18, a second amplifier 20, a phase bit 22, a second hybrid device 24, a matched termination load 26, and an output 28. It should be recognized that in practical applications, the low noise amplifier may include many other components and features that have not been expressly illustrated in FIG. 1, which are not included herein for sake of brevity. However, as a non-limiting example, additional amplifiers may be included in series with the first amplifier 18 and/or the second amplifier 20, as shown in more detail in FIGS. 7A and 7B. Though the term "hybrid device" is used herein, this term is not used to be limiting as other terms may be used, such as, but not limited to, "hybrid," "hybrid coupler," etc., wherein none of these terms are meant to designate some form of limitation not expressly stated, and claimed, herein.

As used herein, the first input 12 may be referred to as a scene port while the second input 14 may be referred to as a reference load port. The scene port 12 may be configured to receive information about a sensed scene whereas the reference load port may be configured to receive information about a baseline or reference, which may be at a known temperature. The first input 12 may be the reference load port while the second input 14 may be the scene port. In an embodiment, one of the inputs may be one type of port while the other input may be the other type of port. However, in other embodiments the roles of the ports may be reversed or both ports may provide sensed scene data or both providing reference data. Thus, those skilled in the art will recognize that the terms "scene port" and "reference load port" are simply used to identify the two ports.

By simultaneously sensing and comparing the information received at the scene port with that received at the reference load port, the radiometer is ultimately able to determine and output the temperature of the sensed scene or, in the alternative, to output the temperature of the baseline or reference of the reference load port. The low noise amplifier 10 may be used to sense the electromagnetic radiation, and therefore the temperature, of sensed scenes such as a portion of the earth (e.g., a field, a river, a lake, etc.), a portion of the heavens (a patch of sky or space), a structure (e.g., a building, a road or bridge, etc.), a portion of the human body, and so on. Contrast in discernible temperatures within the image provides a means of detecting what might not normally be visible.

The first hybrid 16 may be generally interposed between the scene and reference load port on one side and the first and second amplifiers 18, 20 on the other side. Non-limiting examples of the first hybrid 16 may comprise a Lange coupler, a quadrature coupler (or hybrid), or some other suitable coupling device. As such, the first hybrid 16 may be able to function as a four-port system. As a non-limiting example of the four-port system, the first hybrid 16 may provide a first port (top, left) coupled to the scene port (i.e., the first input 12), a second port (top, right) coupled to the first amplifier 18, a third port (bottom, right) coupled to the second amplifier 20, and the fourth port (bottom, left) coupled to the reference load port (i.e., the second input 14). It should be recognized that the relative phase difference between the first port of the first hybrid 16 and the fourth port may be zero degrees. In addition, the relative phase difference between the first port of the first hybrid 16 and the third port may be ninety degrees. The amplitude of the signal at the various ports may remain the same.

Functionally, the first hybrid 16 may be configured to divide each received signal, whether from the first input 12 or the second input 14, such that half is relayed to the first amplifier 18 and the other half is relayed to the second amplifier 20. This will be more fully explained below. The first amplifier 18 and the second amplifier 20 collectively may form a balanced or differential amplifier. The first amplifier 18 and the second amplifier 20 are in two parallel gain stages such that gain is equalized in the two parallel gain stages. In an embodiment, each of the first amplifier 18 and the second amplifier 20 may be a low-noise amplifier or other suitable amplification device.

The phase bit 22 is generally disposed on the opposite side of either the first and second amplifiers 18, 20 relative to the scene and reference load ports. In other words, the phase bit 22 is disposed after the initial amplification stage provided by the first or second amplifiers 18, 20 in the input selective low noise amplifier 10. The single phase bit 22 may be implemented in one or the other of the two amplifier channels. In an embodiment, the phase bit 22 may be implemented in discrete, lumped element fashion (e.g., using capacitors and inductors) or in a distributed fashion (e.g., using transmission lines). It should be recognized that the phase bit 22 may also be formulated from other components, circuits, modules, etc., to generate the desired phase shift. In addition, the phase bit 22 may be controlled by, as a non-limiting example, a single simple, single ended voltage source.

As a result of using the phase bit, vector arithmetic associated with the input and output hybrid combiners, the phase bit 22 may produce RF phasors that may combine to provide the desired path selectively. To maintain optimal RF performance, this function may be located after the initial amplifier stage. Thus, placement as disclosed provides for selectable input directivity without impact on performance. Additionally, control of the phase bit 22 may be achieved through a single, simple, single ended voltage connection.

Thus, the phase shifter function may be implemented in field-effect transistor ("FET") form where the functional addition is MMIC process compatible. Other implementations may include, but are not limited to, capacitors and inductors, transmission lines, etc.

In an embodiment, the phase bit 22 in the input selective low noise amplifier 10 may be a simple one hundred eighty degree phase bit. Therefore, the phase bit 22 is able to change the phase of a received signal by up to one hundred and eighty degrees. The phase bit 22 may change phase from, or between, a first phase or phase shift to a second phase or phase shift. As a non-limiting example, the first phase shift may be a zero degree phase shift and the second phase shift may be a one hundred and eighty (180) degree phase shift. A signal passing the phase bit 22 may be effectively inverted by the phase bit 22. As will be more fully explained below, the phase bit 22 may permit the directivity of the balanced four-port amplifier to be changed without deleteriously impacting RF performance.

The second hybrid 24 is generally interposed between the first and second amplifiers 18, 20 on a first side and the matched termination load 26 and the output 28 on a second side. In an embodiment, the second hybrid 24 may be, as a non-limiting example, a Lange coupler, a quadrature coupler (or hybrid), or some other suitable coupling device. As such, the second hybrid 24 may be considered as a four-port system. As an non-limiting example of the four-port system, the second hybrid 24 may provide a first port (top, left) coupled to the first amplifier 18, a second port (top, right) coupled to the matched termination load 26, a third port (bottom, left) coupled to the second amplifier 20, and the fourth port (bottom, right) coupled to the output 28. In this configuration, it should be recognized that the relative phase difference between the first port of the second hybrid 24 and the fourth port is zero degrees. In addition, the relative phase difference between the first port of the second hybrid 24 and the third port may be ninety degrees. The amplitude of the signal at the various ports may remain the same.

In contrast to the first hybrid 16 which is configured to divide received signals, the second hybrid 24 is generally configured to recombine the received signals, whether from the first amplifier 18 or the second amplifier 20. This combination of signals will be more fully explained, below.

The matched termination load 26 may function to balance the second hybrid 24. The matched termination load 26 may be, as a non-limiting example, a resistor or other component capable of providing impedance. In an embodiment, the matched termination load may be a fifty Ohm (50Ω) resistor. The output 28 may selectively provide the signal received at the scene port or the signal received at the reference load port. Therefore, it should be recognized that the input selective low noise amplifier 10 may comprise a single output port where the amplifier 10 is configured to effectively synchronize between outputs as desired.

In operation, the signal A may be present at the scene port and the signal B may be present at the reference load port. The first hybrid 16 may pass fifty percent (50%) of signal A at 0 degrees (°) to the first amplifier 18 and 50% of signal A at 90° to the second amplifier 20. Likewise, the first hybrid 16 may pass 50% of signal B at 0° to the second amplifier 20 and 50% of signal B at 90° to the first amplifier 18. Therefore, the first amplifier 18 may receive 50% of signal A at 0° and 50% of signal B at 90° and the second amplifier 20 may receive 50% of signal A at 90° and 50% of signal B at 0°.

Next, the phase bit 22 may be toggled between a zero degree state and a one hundred and eighty degree state. When the phase bit 22 is in the zero degree state, the output at the output 28 may be signal A. In contrast, when the phase bit 22 is in the one hundred and eighty degree state, the output at the output at the output 28 may be signal B.

When the phase bit 22 is in the zero degree state, the second hybrid 24 may pass 50% of signal A at 90° and 50% of signal B at 180° from the first amplifier 18 channel and 50% of signal A at 90° and 50% of signal B at 0° from the second amplifier 20 channel to the output 28. Because 50% of signal B at 180° and 50% of signal B at 0° nulls or may cancel each other out, the output at the output 28 may become 50% of signal A at 90° plus another 50% of signal A at 90°, or simply all of the signal A at 90°.

Likewise, when the phase bit 22 is in the one hundred and eighty degree stage, the second hybrid 24 passes 50% of signal A at 270° and 50% of signal B at 0° from the first amplifier 18 channel and 50% of signal A at 90° and 50% of signal B at 0° from the second amplifier 20 channel to the output 28. Because 50% of signal A at 270° and 50% of signal A at 90° may null or cancel each other out, the output at the output 28 becomes 50% of signal B at 0° plus another 50% of signal B at 0°, or simply all of the signal B at 0°. So, depending on the state of the phase bit 22, the output of the output 28 may be signal A or signal B.

Figure 2A:
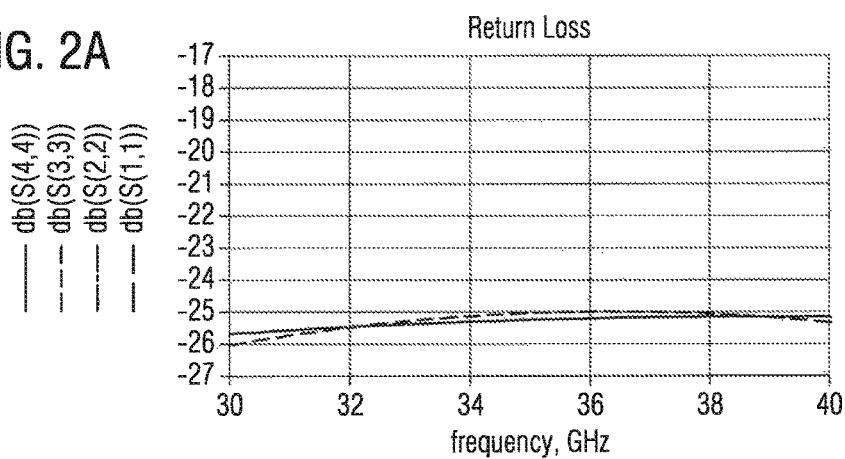
FIGS. 2A-2D show a collection of simulation results of the embodiment of FIG. 1 illustrating an embodiment input selective low noise amplifier with the phase bit in the reference (zero degree) state.
Figure 2B:
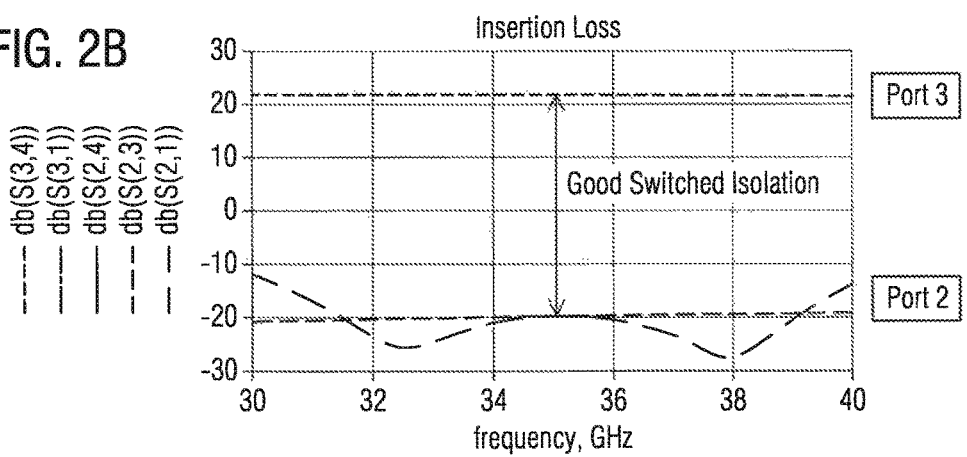
Figure 2C:
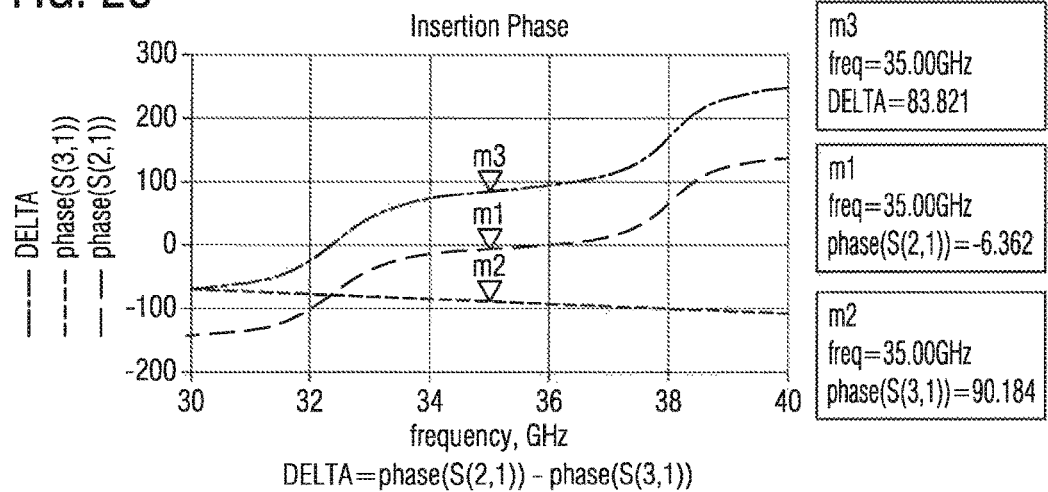
Figure 2D:
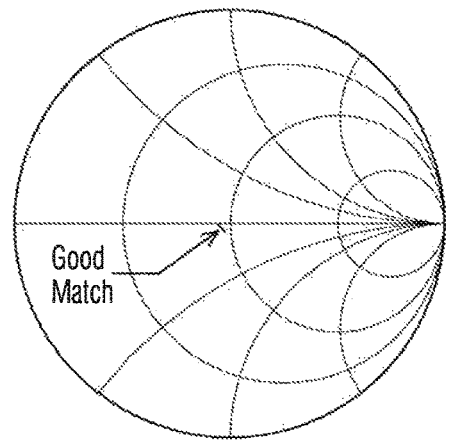

Referring now to FIGS. 2A-2D, a collection of simulation results illustrating an embodiment radiometer of FIG. 1 with the phase bit in the reference (zero degree) state is shown. FIG. 2A shows a return of loss of the radiometer in decibels over a frequency of 30 Gigahertz (GHz) to 40 GHz. FIG. 2B shows insertion loss at port 3 and port 2 of the first hybrid 16 when considered as a 4-port system. FIGS. 2C and 2D show modeled network parameters that illustrate radio frequency (RF) performance of the embodiment of FIG. 1.

Figure 3A:
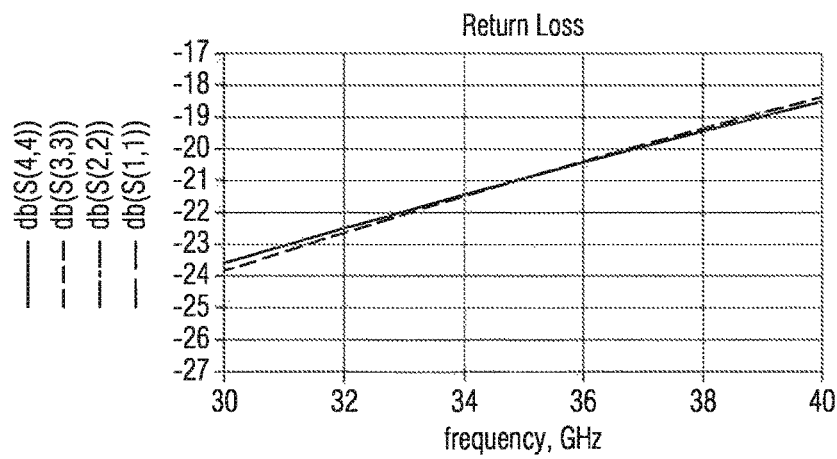
FIGS. 3A-3D show a collection of simulation results of the embodiment of FIG. 1 illustrating an embodiment input selective low noise amplifier with the phase bit in the complementary (one hundred 180 degree) state.
Figure 3B:
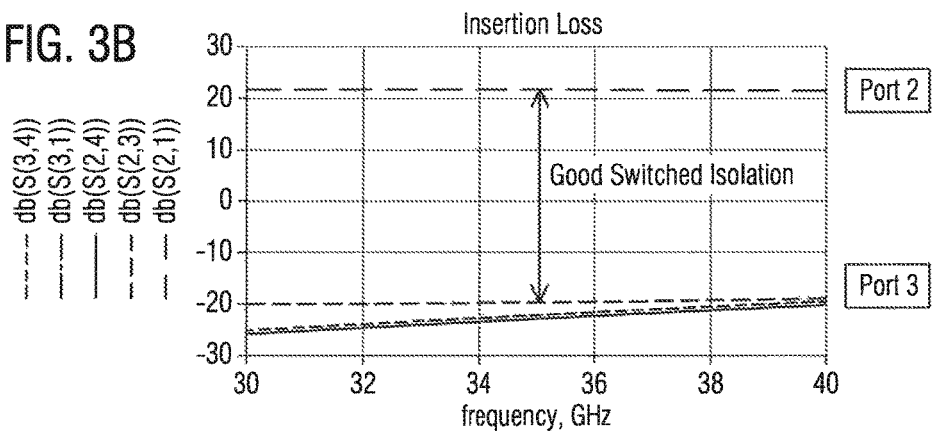
Figure 3C:
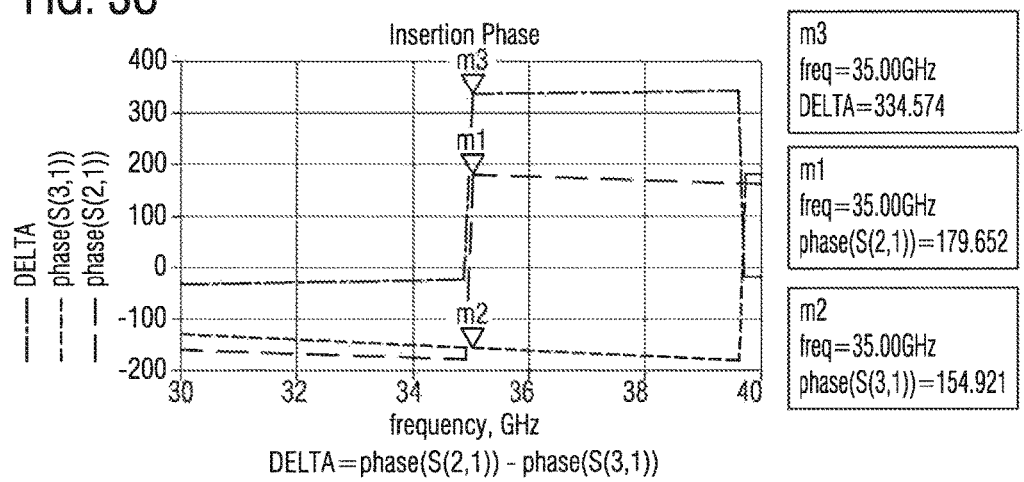
Figure 3D:
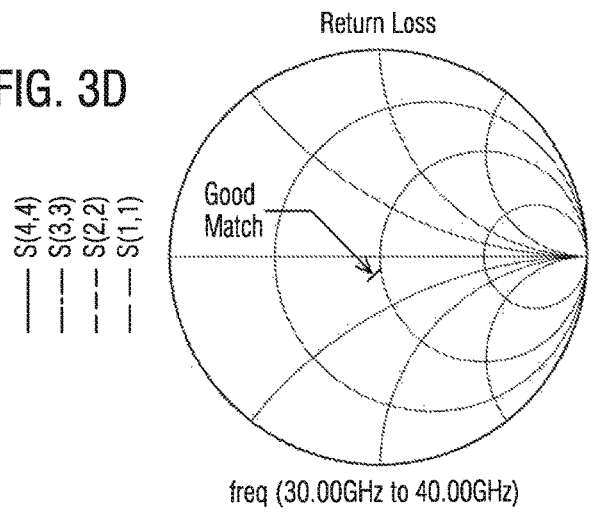

In FIGS. 3A-3D, a collection of simulation results illustrating an embodiment of the radiometer with the phase bit in the complementary (180 degree) state is shown. FIG. 3A shows a return of loss of the radiometer in decibels over a frequency of 30 GHz to 40 GHz. FIG. 3B shows insertion loss at port 2 and port 3 of the first hybrid 16 when considered as a 4-port system. FIGS. 2C and 2D show modeled network parameters that illustrate radio frequency (RF) performance of the embodiment with the radiometer with the phase bit in the complementary state.

Figure 4B:
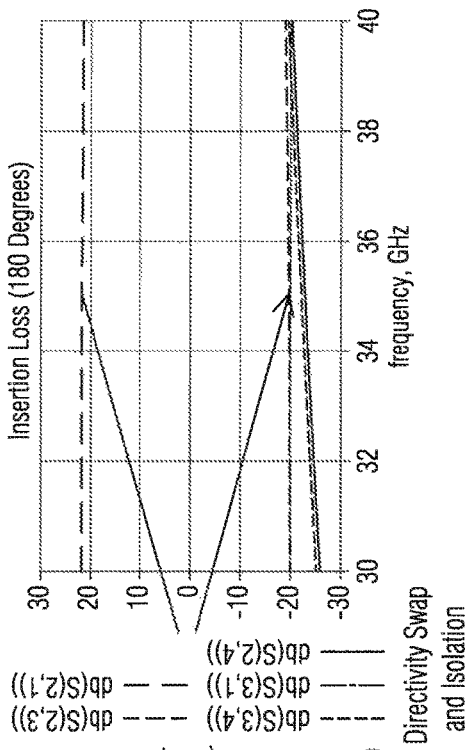
FIGS. 4A-4B show simulation results collectively illustrating an insertion loss contrast between the reference state of FIG. 2B and the complementary state of FIG. 3B.
Figure 4A:
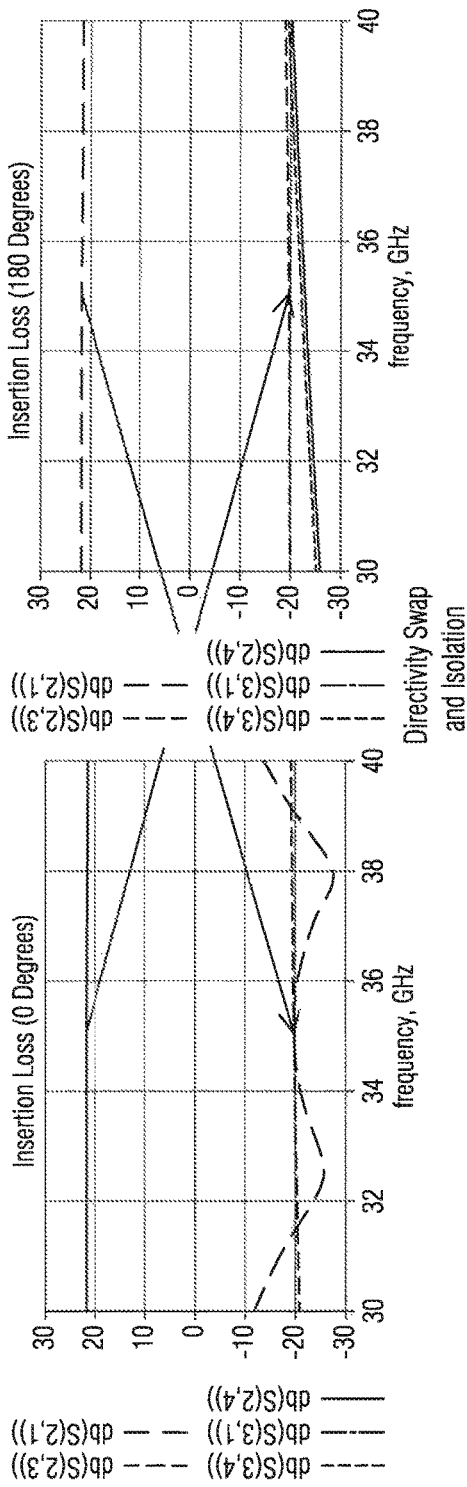

In FIGS. 4A-4B, simulation results collectively illustrating an insertion loss contrast between the reference state of FIG. 2B and the complementary state of FIG. 3B are shown. As illustrated, synchronizing between zero degrees and 180 degrees may result in directivity swap of port 3 and port 2 and isolation so that the low noise performance of the radiometer is not diminished.

Figure 5:
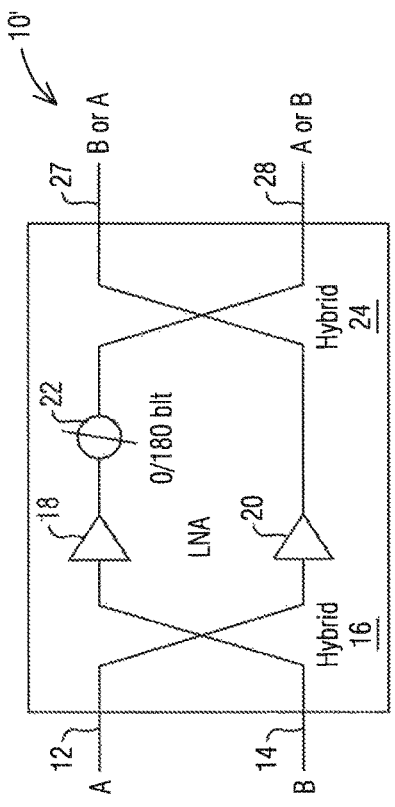
FIG. 5 shows an embodiment input selective low noise amplifier with a dual output including a phase bit.

Referring now to FIG. 5, an embodiment input selective low noise amplifier 10 is schematically illustrated. As shown, the input selective low noise amplifier 10 may include a first input 12, a second input 14, a first hybrid device 16, a first amplifier 18, a second amplifier 20, a phase bit 22, a second hybrid 24, a first output 27, and a second output 28. It should be recognized that in practical applications the radiometer may include many other components and features that have not been expressly illustrated in FIG. 1 for the sake of brevity.

The second hybrid 24 is generally interposed between the first and second amplifiers 18, 20 on one side and the first and second outputs 27, 28 on the other side. In an embodiment, the second hybrid 24 may be, as non-limiting examples, a Lange coupler, a quadrature coupler, or some other suitable coupling device. As such, the second hybrid 24 may be able to function as a four-port system.

As a non-limiting example of the four-port system, the second hybrid 24 may provide a first port (top, left) coupled to the first amplifier 18, a second port (top, right) coupled to the first output 27, a third port (bottom, left) coupled to the second amplifier 20, and the fourth port (bottom, right) coupled to the second output 28. In this configuration, it should be recognized that the relative phase difference between the first port of the second hybrid 24 and the fourth port may be zero degrees. In addition, the relative phase difference between the first port of the second hybrid 24 and the third port may be ninety degrees. The amplitude of the signal at the various ports may remain the same.

The first output 27 may selectively provide the signal received at the scene port or the signal received at the reference load port. Likewise, the second output 28 may also selectively provide the signal received at the scene port or the signal received at the reference load port. Therefore, it should be recognized that the input selective low noise amplifier 10 is able to effectively synchronize between outputs as desired.

In operation, the signal A may be present at the scene port and the signal B may be present at the reference load port. The first hybrid 16 may pass 50% of signal A at 0° to the first amplifier 18 and 50% of signal A at 90° to the second amplifier 20. Likewise, the first hybrid 16 may pass 50% of signal B at 0° to the second amplifier 20 and 50% of signal B at 90° to the first amplifier 18. Therefore, the first amplifier 18 may receive 50% of signal A at 0° and 50% of signal B at 90° and the second amplifier 20 may receive 50% of signal A at 90° and 50% of signal B at 0°.

Next, the phase bit 22 may be toggled between a zero degree state and a one hundred and eighty degree state. As will be more fully explained below, when the phase bit 22 is in the zero degree state, the output at the first output 27 may be signal B and the output at the second output 28 may be signal A. In contrast, when the phase bit 22 is in the one hundred and eighty degree state, the output at the first output 27 may be signal A and the output at the second output 28 may be signal B.

When the phase bit 22 is in the zero degree state, the second hybrid 24 may pass 50% of signal A at 0° and 50% of signal B at 90° from the first amplifier 18 channel and 50% of signal A at 180° and 50% of signal B at 90° from the second amplifier 20 channel to the first output 27. Because 50% of signal A at 180° and 50% of signal A at 0° may null or may cancel each other out, the output 26 may become 50% of signal B at 90° plus another 50% of signal B at 90°, or simply all of the signal B at 90°.

Likewise, when the phase bit 22 is in the zero degree state, the second hybrid 24 may pass 50% of single A at 90° and 50% of signal B at 180° from the first amplifier 18 channel and 50% of signal A at 90° and 50% of signal B at 0° from the second amplifier 20 channel to the second output 28. Because 50% of signal B at 180° and 50% of signal B at 0° may null or may cancel each other out, the output at the second output 28 may become 50% of signal A at 90° plus another 50% of signal A at 90°, or simply all of the signal A at 90°.

When the phase bit 22 is in the one hundred and eighty degree state, the second hybrid 24 may pass 50% of signal A at 180° and 50% of signal B at 270° from the first amplifier 18 channel and the 50% of signal A at 180° and 50% of signal B at 90° from the second amplifier 20 channel to the first output 27. Because 50% of signal B at 270° and 50% of signal B at 90° nulls or may cancel each other out, the output at the first output 26 may become 50% of signal A at 180° plus another 50% of signal A at 180°, or simply all of the signal A at 180°.

Likewise, when the phase bit 22 is in the one hundred and eighty degree stage, the second hybrid 24 passes 50% of signal A at 270° and 50% of signal B at 0° from the first amplifier 18 channel and 50% of signal A at 90° and 50% of signal B at 0° from the second amplifier 20 channel to the second output 28. Because 50% of signal A at 270° and 50% of signal A at 90° may null or may cancel each other out, the output at the second output 28 becomes 50% of signal B at 0° plus another 50% of signal B at 0°, or simply all of the signal B at 0°. So, depending on the state of the phase bit 22, the output of the first output 27 may be signal B or signal A and the output of the second output 28 may be signal A or signal B.

From the foregoing, it should be recognized that the embodiment of the input selective low noise amplifier 10 offers numerous benefits and advantages. In particular, the embodiment input selective low noise amplifier 10 may provide a solution for practical low loss path selectivity within a monolithic low noise amplifier design. The input selective low noise amplifier 10 disclosed herein may provide a well matched, dual input, selectively directive dual output, low noise amplifier MMIC (microwave monolithic integrated circuit) without RF switch definitions as the input-to-output path selecting elements, where a single output is provided as illustrated in FIG. 1, or a duel output is provided as illustrated in FIG. 5. When using the input selective low noise amplifier 10 illustrated in FIG. 1, the MMIC may be a 3-port amplifier.

Figure 6:
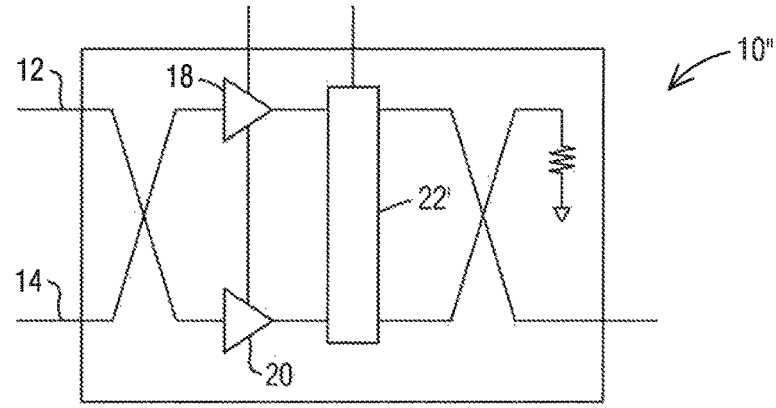
FIG. 6 shows another embodiment of input selective low noise amplifier including a phase bit across both lines.

FIG. 6 shows an embodiment of another input selective low noise amplifier 10" including a phase bit across both lines. As illustrated, a phase bit 22' is generally disposed on the opposite side of both the first amplifier 18 and the second amplifier 20. In this configuration, the single phase bit 22' can selectively apply a phase shift to either output from the respective amplifier 18, 20 or to both outputs. More specifically, considering the first amplifier 18 with a first line, the second amplifier 20 within a second line, the phase bit 22' may control either the first line, the second line, or both lines. In another non-limiting embodiment, the phase bit 22' may actually comprise two independent phase bits 22, with one in each line before the respective amplifier 18, 20. The input selective low noise amplifier 10" may be utilized in the radiometer 900 of FIG. 9.

Thus, each output is capable of producing a first signal and a second signal delayed in phase/time. Furthermore, as disclosed herein, the hybrid couplers are quadrature hybrid couplers. Wherein one path is at 0 degrees and the other is at 90 degrees. At the output either the first signal is available or the second signal is available, but never both at the same time. The quadrature function cancels signals out.

Figure 7A:
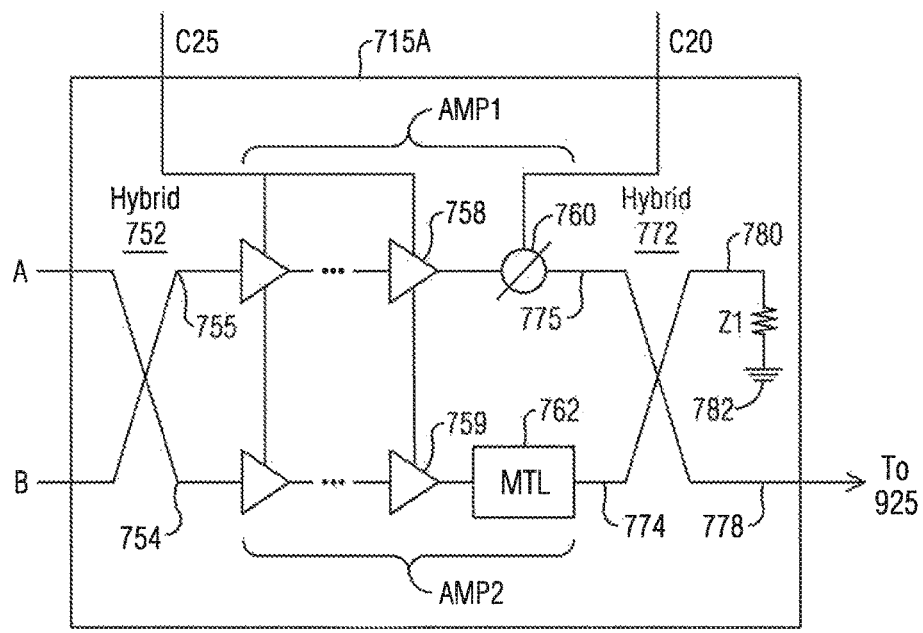
FIG. 7A illustrates a schematic diagram of the input selective low noise amplifier with one output line.
Figure 9:
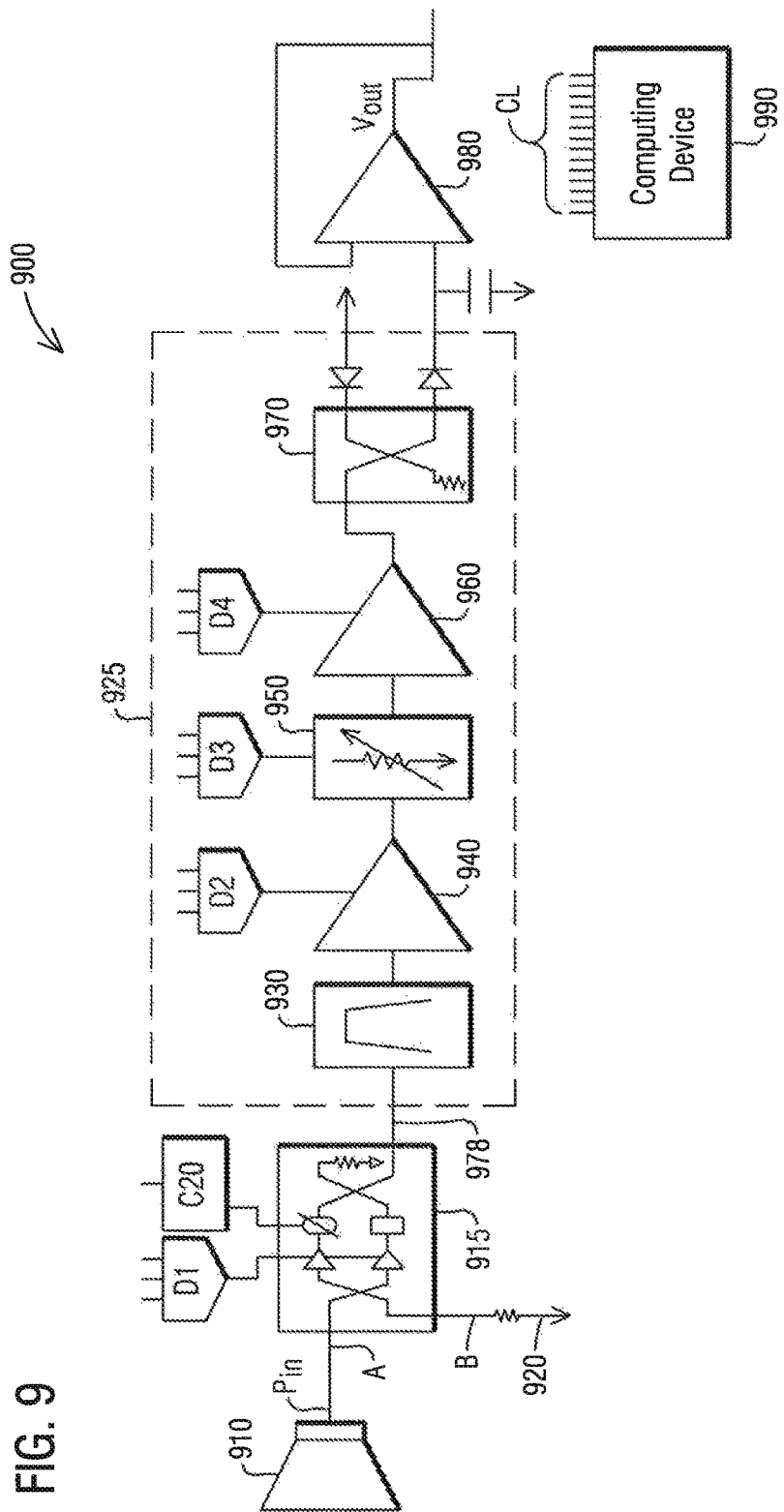
FIG. 9 shows an embodiment of input selective low noise amplifier as part of a radiometer.

FIG. 7A illustrates a schematic diagram of the input selective low noise amplifier 715A. The input selective LNA 715A includes input hybrid device 752 having output 755 and output 754, each coupled to a parallel path. In a first path, the LNA 715A includes at least one of a first amplifier 758. In an embodiment, the first path includes a plurality of amplifiers AMP1 configured to have their gains controlled via control line C25 from the computing device 990 (FIG. 9). In a second path, the LNA 715A includes a second amplifier 759. In an embodiment, the second path includes a plurality of amplifiers AMP2 configured to have their gains controlled via control line C25 from the computing device 990 (FIG. 9). In an embodiment, the gains may be controlled by different control lines independently. The first path is parallel to the second path.

The LNA 715A includes phase bit 760 connected to at least one of the at least first amplifier 758 and the at least second amplifier 759. In this embodiment, the phase bit 760 is shown coupled to the first amplifier 758. The input selective LNA 715A may include an output hybrid device 772 having a first input 775 from the first path. The first input 775 is coupled to the phase shift 760. The phase bit 760 may be configured to generate a phase between a first phase shift and a second phase shift at an output 778 of the amplifier the phase bit 760 is connected to, with detector 970 configured to receive a signal from the amplifier the phase bit 760 is connected to, according to its phase. In an embodiment, the at least first amplifier 758 in the top path is connected to phase bit 760. The at least one second amplifier 759 in the bottom path is connected to a matching circuit (MTL) 762. The output of MTL 762 may be coupled to input 774 of the output hybrid device 772.

The output hybrid device 772 includes output 778. However, the output hybrid device 772 includes a second output on line 780 coupled to impedance Z1. The impedance Z1 is coupled to matched termination load port 282. The output 778 may be sent to radiometer channel 925 and specifically, filter 930.

The input selective LNA 715A is switchless and is balanced. The phase bit 760 may be a controlled phase shifter or a phase switch. The phase bit 760 may be dynamically controlled for different modes of operation described herein via control line C20.

In a first mode, the output 778 includes the signal from the reference load 920 (FIG. 9) on the second input B. The first mode may be a calibration mode where the radiometer channel is calibrated. The reference load 920 (FIG. 9) may be a Dicke reference load. The phase bit 760 may be variable.

In the first mode, the output 778 may output the signal representative of temperature reference of a Dicke reference load 920 (FIG. 9).

In a second mode, the output 778 produces the signal representative of the first input A from the scene port received by antenna 910 (FIG. 9). The second mode is a receiving mode of the radiometer 900 (FIG. 9)

Figure 7B:
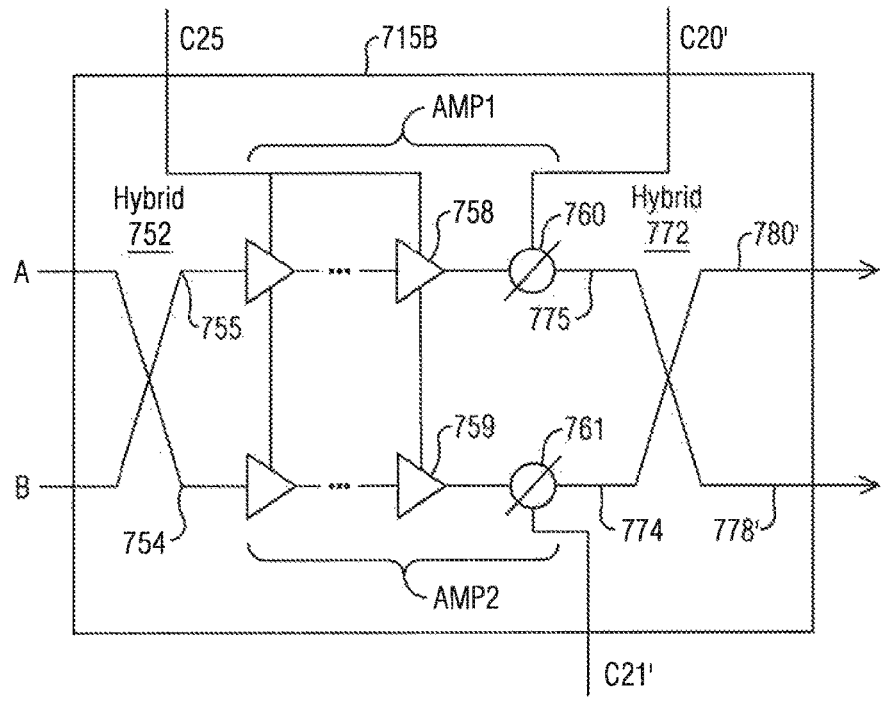
FIG. 7B illustrates a schematic diagram of the input selective low noise amplifier with two output lines.

FIG. 7B illustrates a schematic diagram of the input selective low noise amplifier (LNA) 715B with two outputs 778' and 780' and two phase bits 760 and 761. The LNA 715B is balanced and switchless similarly to LNA 715A with dual parallel amplifier channels (i.e., amplifiers AMP1 and amplifiers AMP2). In the embodiment of LNA 715B, the load Z1 and matched termination load port 282 are removed. In a similar manner as described in relation to FIG. 7A, the phase bit 760 would be controlled, on control line C20', to adjust the phase of the signals at the first input A and the second input B for the modes described above. One mode may be a calibration mode and the other a receiving mode.

LNA 715B includes a second phase bit 761 which may be controlled by the computing device 990 via control line C21'. Adjusting the phases of the signals via phase bit 761 from the at least one amplifier 759 allows signals from first input A and/or second input B to be presented to output 780'. Therefore, the signal or signals on output 780' of the output hybrid device 772 may be utilized in another radio channel, detectors or other processes.

It should be recognized that in practical applications, the low noise amplifier (i.e., LNA 715A or LNA 715B) may include many other components and features that have not been expressly illustrated in FIGS. 7A and 7B, which are not included herein for sake of brevity.

FIG. 9 shows an embodiment of another input selective low noise amplifier as part of a radiometer 900. As illustrated with respect to the input selective low noise amplifier 915, a phase bit is generally disposed on the opposite side of either the first amplifier. A matching circuit 762 (FIG. 7A) is also disclosed in a line which does not have the phase bit, as shown in FIG. 7A. The matching circuit 762 (FIG. 7A) may be provided to balance an effect caused by operation of the phase bit. The phase bit of amplifier 915 is variable and configured to receive control signals from computing device 990 on control line C20.

Signals from an antenna 910 are provided at one input (i.e., input 12), such as but not limited to input A, of the input selective low noise amplifier 915. A reference load 920 is provided at the second input (i.e., input 14), such as, but not limited to, input B, of the input selective low noise amplifier 915. The amplification or gain of amplifiers (i.e., amplifier 18 and 20) may be controlled via computing device 990 via control lines CL and digital-to-analog converter D1.

Turning to the rest of the radiometer 900, output from the input selective low noise amplifier 915 passes through a filter 930. The filter 930 may be a bandpass filter and may be configured to determine a desired RF bandwidth (BW) of the radiometer channel 925. The bandpass filter may be a microstrip bandpass filter. The bandpass filter may suppress out-of-band noise and remove out of band gain contributions.

The output of filter 930 may then pass through another low noise amplifier 940, an attenuator 950, a third low noise amplifier 960 and then to a detector 970. Output from the detector is provided to an amplifier 980. A capacitor may be connected between the detector 970 and amplifier 980. The detector 970 may be a square-law detector that produces a DC output directly proportional to the receiver's input noise power. The detector 970 may include one or more detector diodes. The square-law detector may be a fill cycle, balanced, antiparallel diode, square-law detector that produces a DC output voltage $V_{out}$ directly proportional to the receiver input noise power. In an "analog configuration" a subsequent analog RC integrator may serve as a low pass filter that smoothes the detector output and/or establishes the analog integration time constant. In a selectable "digital configuration," the detector 970 may allow raw detector data to be recorded and subsequently conditioned at whatever integration time is desired.

The amplifier 940 and amplifier 960 may be low noise amplifiers (LNAs). The analog attenuators may optimize the radio frequency (RF) detector response, and may also be used to mitigate temperature induced changes in overall RF gain. By way of non-limiting example, the at least one attenuator 950 may be a variable analog attenuator. In an embodiment, there may be two or more variable attenuators 950. For example, another variable attenuator may be after amplifier 960 and before detector 970.

The amplifiers 940, 960 and attenuator 950 may receive control signals from one or more control lines CL of the computing device 990 via digital-to-analog converters D2, D3 and D4. The computing device 990 may control synchronization and gain of one or more amplifiers and attenuators of the system 900.

Thus, what is illustrated in FIG. 9 is a selective low noise amplifier having at least one of a first amplifier and a second amplifier with a phase bit connected to at least one of the at least first amplifier and the at least second amplifier, the phase bit configured to generate a phase between a first phase shift and a second phase shift at an output of the amplifier the phase bit is connected to and with a detector configured to receive a signal from the amplifier the phase bit is connected to.

Figure 8:
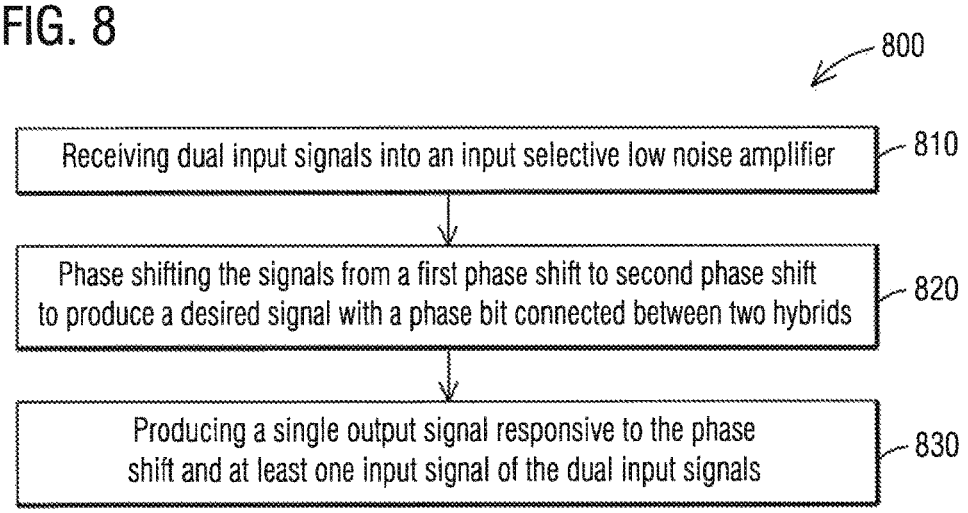
FIG. 8 shows a flowchart illustrating an embodiment of a method.

FIG. 8 shows a flowchart illustrating an embodiment of a method based on an embodiment disclosed herein. The method 800 comprises receiving a dual input signals into an input selective low noise amplifier, at 810. The method further comprises phase shifting the signals from a first phase shift (such as, but not limited to, a zero degree phase shift) to a second phase shift (such as, but not limited to, one hundred and eighty degree phase shift) to produce a desired signal with a phase bit connected between two hybrids, at 820. The method further comprises producing a single output signal responsive to the phase shift and at least one input signal of the dual input signals, at 830.

The addition of a 180 degree phase bit provides a way of changing the directivity of the four port amplifier without deleteriously impacting RF performance. This single phase bit can be implemented in either one of the two parallel amplifier channels. In conjunction with the vector arithmetic associated with the input and output hybrid combiners, this 180 degree phase bit will produce RF phasors that will combine to provide the desired path selectivity. To maintain optimal RF performance, this function is located after the noise performance setting, initial amplifier stage. Proper placement of this simple function allows for selectable directivity without performance impact. Because the phase shifter function can be implemented in FET form, the functional addition is MMIC process compatible.

Moreover, the inventive concept disclosed herein eliminates the switches found in conventional radiometers in favor of a simple, low loss vector/phasor synchronizing technique.

Figure 10:
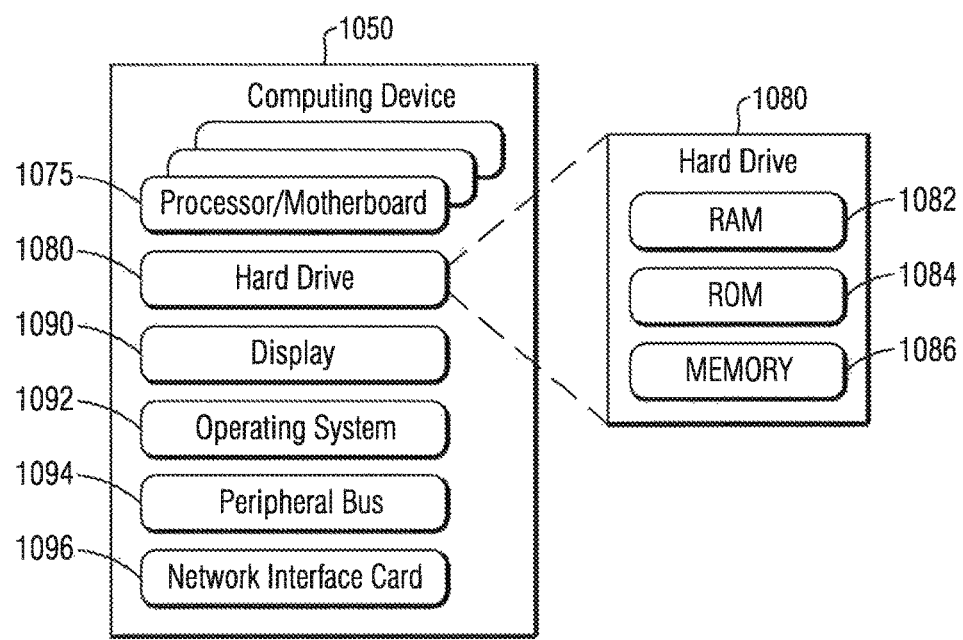
FIG. 10 shows a block diagram of a computing device.

Referring now to FIG. 10, in a basic configuration, the computing device 1050 may include any type of stationary computing device or a mobile computing device. Computing device 1050 may include one or more processors 1075 and system memory in hard drive 1080. Depending on the exact configuration and type of computing device, system memory may be volatile (such as RAM 1082), non-volatile (such as read only memory (ROM 1084), flash memory 1086, and the like) or some combination of the two. System memory may store operating system 1092, one or more applications, and may include program data for performing one or more blocks of process 800. The computing device 1050 may carry out one or more blocks of process 800. Computing device 1050 may also have additional features or functionality. For example, computing device 1050 may also include additional data storage devices (removable and/or non-removable) such as, for example, magnetic disks, optical disks, or tape. Computer storage media may include volatile and non-volatile, non-transitory, removable and non-removable media implemented in any method or technology for storage of data, such as computer readable instructions, data structures, program modules or other data. System memory, removable storage and non-removable storage are all examples of computer storage media. Computer storage media includes, but is not limited to, RAM, ROM, Electrically Erasable Read-Only Memory (EEPROM), flash memory or other memory technology, compact-disc-read-only memory (CD-ROM), digital versatile disks (DVD) or other optical storage, magnetic cassettes, magnetic tape, magnetic disk storage or other magnetic storage devices, or any other physical medium which can be used to store the desired data and which can be accessed by computing device. Any such computer storage media may be part of device. The code may be stored or encoded on non-transitory, tangible computer readable medium.

Computing device 1050 may also include or have interfaces for input device(s) (not shown) such as a keyboard, mouse, pen, voice input device, touch input device, etc. The computing device 1050 may include or have interfaces for connection to output device(s) such as a display 1090, speakers, etc. The computing device 1050 may include a peripheral bus 1094 for connecting to peripherals. Computing device 1050 may contain communication connection(s) that allow the device to communicate with other computing devices, such as over a network or a wireless network. By way of example, and not limitation, communication connection(s) may include wired media such as a wired network or direct-wired connection, and wireless media such as acoustic, radio frequency (RF), infrared and other wireless media. The computing device 1050 may include a network interface card 1096 to connect (wired or wireless) to a network.

Computer program code for carrying out operations described above may be written in a variety of programming languages, including but not limited to a high-level programming language, such as C or C++, for development convenience. In addition, computer program code for carrying out operations of embodiments described herein may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed Digital Signal Processor (DSP) or microcontroller. A code in which a program of the embodiments is described can be included as a firmware in a RAM, a ROM and a flash memory. Otherwise, the code can be stored in a tangible computer-readable storage medium such as a magnetic tape, a flexible disc, a hard disc, a compact disc, a photo-magnetic disc, a digital versatile disc (DVD).

The embodiments may be configured for use in a computer or a data processing apparatus which includes a memory, such as a central processing unit (CPU), a RAM and a ROM as well as a storage medium such as a hard disc.

The "step-by-step process" for performing the claimed functions herein is a specific algorithm, and may be shown as a mathematical formula, in the text of the specification as prose, and/or in a flow chart. The instructions of the software program create a special purpose machine for carrying out the particular algorithm. Thus, in any means-plus-function claim herein in which the disclosed structure is a computer, or microprocessor, programmed to carry out an algorithm, the disclosed structure is not the general purpose computer, but rather the special purpose computer programmed to perform the disclosed algorithm.

A general purpose computer, or microprocessor, may be programmed to carry out the algorithm/steps for creating a new machine. The general purpose computer becomes a special purpose computer once it is programmed to perform particular functions pursuant to instructions from program software of the embodiments described herein. The instructions of the software program that carry out the algorithm/steps electrically change the general purpose computer by creating electrical paths within the device. These electrical paths create a special purpose machine for carrying out the particular algorithm/steps.

Unless otherwise defined, all terms (including technical and scientific terms) used herein have the same meaning as commonly understood by one of ordinary skill in the art to which embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In particular, unless specifically stated otherwise as apparent from the discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such data storage, transmission or display devices.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

While various disclosed embodiments have been described above, it should be understood that they have been presented by way of example only, and not limitation. Numerous changes to the subject matter disclosed herein can be made in accordance with the embodiments disclosed herein without departing from the spirit or scope of the embodiments. In addition, while a particular feature may have been disclosed with respect to only one of several implementations, such feature may be combined with one or more other features of the other implementations as may be desired and advantageous for any given or particular application. Therefore, the breadth and scope of the subject matter provided herein should not be limited by any of the above explicitly described embodiments. Rather, the scope of the embodiments should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While embodiments have been described with reference to various embodiments, it will be understood by those skilled in the art that various changes, omissions and/or additions may be made and equivalents may be substituted for elements thereof without departing from the spirit and scope of the embodiments. In addition, many modifications may be made to adapt a particular situation or material to the teachings of the embodiments without departing from the scope thereof. Therefore, it is intended that the embodiments not be limited to the particular embodiment disclosed as the best mode contemplated, but that all embodiments falling within the scope of the appended claims are considered.

What is claimed is:

1. A selective low noise amplifier (LNA) comprising:
   an LNA input side having a first input port and a second input port;
   an LNA output side having selective directive dual outputs comprising a first LNA output and a second LNA output;
   an input hybrid coupler configured to receive a first input from the first input port and a second input from the second input port and to provide a first output and a second output;
   an output hybrid coupler comprising a first input port, a second input port, a first output port coupled to the LNA first output and a second output port coupled to the LNA second output;
   a first amplifier and a second amplifier, each respective amplifier in first and second parallel paths couple to and between the first output and the second output, respectively, of the input hybrid coupler and the first input port and the second input port, respectively, of the output hybrid coupler; and
   a phase controller coupled to at least one of the first input port and the second input port of the output hybrid coupler to delay signals to the output hybrid coupler so that all of the first input is presented to the first output port of the output hybrid coupler for output to the first LNA output and all of the second input is presented to the second output port of the output hybrid coupler for output to the second LNA output.

2. The selective LNA according to claim 1, wherein at least one of the first input hybrid coupler and the output hybrid coupler comprises quadrature hybrid couplers.

3. The selective LNA according to claim 1, wherein the first and second parallel paths each comprises a plurality of amplifiers coupled in series.

4. The selective LNA according to claim 3, wherein the gain of the plurality of amplifiers is controlled by a computing device.

5. The selective LAN according to claim 1, wherein the gain of the first amplifier and the second amplifier is variable.

6. The selective LNA according to claim 1, wherein the phase controller phase shifts the signal to the first input port and second input port of the output hybrid coupler wherein the amount of phase shift is variable.

7. The selective LNA according to claim 6, wherein the first input comprises a first signal representing a scene captured by a radiometer and a second input comprises a second signal representative of a reference load having a known temperature, wherein the phase shift delays the first signal from the second signal.

8. The selective LNA according to claim 1, wherein the selective low noise amplifier is implemented in a microwave monolithic integrated circuit (MMIC).

9. A selective low noise amplifier (LNA), comprising:
   an LNA input side having a first input port and a second input port;
   an LNA output side having selective directive dual outputs comprising a first LNA output and a second LNA output;
   an input hybrid coupler having a first port to receive a first input signal from the first input port, a second port to output a first resulting signal, a third port to output a second resulting signal, and a fourth port to receive a second input signal from the second input port;
   first and second parallel amplifier channels producing first and second amplified signals, each parallel amplifier channel having a plurality of variable gain amplifiers, the first resulting signal coupled to the first parallel amplifier channel and the second resulting signal coupled to the second parallel amplifier;
   a first phase shifter coupled to the first parallel amplifier channel, the first phase shifter to shift a phase of the first amplified signal from the first parallel amplifier channel to create a first phase shifted signal;
   a second phase shifter coupled to the second parallel amplifier channel, the second phase shifter to shift a phase of the second amplified signal from the second parallel amplifier channel to create a second phase shifted signal; and
   an output hybrid coupler comprising a first output port and a second output port coupled to the selective directive dual outputs of the LNA output side, a first input port coupled to the first parallel amplifier channel, and a second input port coupled to the second parallel amplifier channel, the output hybrid coupler to generate all of the first input signal at the first output port of the output hybrid coupler and all of the second input signal at the second output port of the output hybrid coupler synchronized to the first LNA output according to a receive mode and a second LNA output according to a calibration mode.

10. The selective LNA according to claim 9, wherein the selective LNA is implemented in a microwave monolithic integrated circuit (MMIC).

11. The selective LNA according to claim 9, wherein the first phase shifter is variable to control the phase of the first amplified signal and the second phase shifter is variable to control the phase of the second amplified signal.

12. The selective LNA according to claim 9, wherein a gain of the plurality of variable gain amplifiers in the first parallel amplifier channel is controlled by a computing device; and a gain of the plurality of variable gain amplifiers in the second parallel amplifier channel is controlled by the computing device.

13. A method comprising:
   receiving a first input signal at a first input port of an input hybrid coupler and a second input signal at a second input port of the input hybrid coupler;
   generating, by the input hybrid coupler, a first resulting signal at a first output port of the input hybrid coupler and a second resulting signal at a second output port of the input hybrid;
   amplifying in first and second parallel amplifier channels the first and second resulting signals, respectively, to produce first and second amplified signals, the first resulting signal coupled to the first parallel amplifier channel and the second resulting signal coupled to the second parallel amplifier;
   phase shifting, by a first phase shifter coupled to the first parallel amplifier channel, a phase of the first amplified signal from the first parallel amplifier channel to create a first phase shifted signal;
   phase shifting, by a second phase shifter coupled to the second parallel amplifier channel, a phase of the second amplified signal from the second parallel amplifier channel to create a second phase shifted signal; and
   generating by an output hybrid coupler coupled to the first parallel amplifier channel and the second parallel channel, all of the first input signal at a first output port of the output hybrid coupler according to a receive mode and all of the second input signal at a second output port of the output hybrid coupler according to a calibration mode.

14. The method according to claim 13, further comprising variably controlling a gain of the first and second parallel amplifier channels.

15. The method according to claim 13, further comprising:
   controlling the phase shifting of the first phase shifter and the second phase shifter to selectively cause all of the first input to present to the second output port of the output hybrid coupler for output to the first LNA output and cause all of the second input to present to the first output port of the output hybrid coupler for output to the second LNA output.

16. The selective LNA according to claim 1, wherein:
   the first LNA output is coupled to one of a first detector and a first radio channel; and
   the second LNA output coupled to one of a second detector and a second radio channel.

17. The selective LNA according to claim 1, wherein the phase controller is controlled to selectively cause all of the first input to present to the second output port of the output hybrid coupler for output to the first LNA output and cause all of the second input to present to the first output port of the output hybrid coupler for output to the second LNA output.

18. The selective LNA according to claim 9, wherein the first phase shifter and the second phase shifter are controlled to selectively cause all of the first input to present to the second output port of the output hybrid coupler for output to the first LNA output and cause all of the second input to present to the first output port of the output hybrid coupler for output to the second LNA output.

19. The selective LNA according to claim 9, wherein:
   the first LNA output is coupled to one of a first detector and a first radio channel; and
   the second LNA output coupled to one of a second detector and a second radio channel.

* * * * *